United States Patent [19]

Ahn

[11] Patent Number: 5,377,214
[45] Date of Patent: Dec. 27, 1994

[54] TENSILE STRAINED BLUE GREEN II-VI QUANTUM WELL LASER

[75] Inventor: Do Y. Ahn, Kyungki, Rep. of Korea

[73] Assignee: Goldstar Electron Co., Ltd., Choongchungbook, Rep. of Korea

[21] Appl. No.: 187,332

[22] Filed: Jan. 26, 1994

[30] Foreign Application Priority Data

Jan. 26, 1993 [KR] Rep. of Korea .................. 890/1993

[51] Int. Cl.$^5$ ............................................. H01S 3/19
[52] U.S. Cl. ..................................... 372/45; 372/46; 257/13; 257/14; 257/22; 257/78; 257/103
[58] Field of Search ................... 372/45, 46; 257/13, 257/14, 15, 103, 79, 22, 201, 78

[56] References Cited

U.S. PATENT DOCUMENTS

| | | | |
|---|---|---|---|
| 5,090,790 | 2/1992 | Zucker | 385/130 |
| 5,260,958 | 11/1993 | Fitzpatrick | 372/45 |
| 5,268,918 | 12/1993 | Akimoto et al. | 372/45 |
| 5,319,219 | 6/1994 | Cheng et al. | 372/45 |

Primary Examiner—Georgia Y. Epps
Attorney, Agent, or Firm—Lowe, Price, LeBlanc & Becker

[57] ABSTRACT

There is disclosed a tensile strained blue-green II-VI quantum well laser. The tensile strained blue-green II-VI quantum well laser comprises of a semiconductor substrate; a buffer layer formed on the semiconductor substrate; a first ZnSe cladding layer formed on the buffer layer; a multi-quantum well layer formed on the first ZnSe cladding layer, consisting of a $ZnS_ySe_{1-y}$ active region and a $Mg_zZn_{1-z}S_wSe_{1-w}$ barrier region; a current-restricting layer formed on the multi-quantum well layer; a second ZnSe cladding layer formed on the current-restricting layer; and a cap layer formed on the second ZnSe cladding layer. The inventive tensile strained blue-green II-VI quantum well laser is capable of reducing the oscillation wavelength into not more than 500 nm at room temperature and of lowering the threshold current density to as low as 1,000 A/cm$^2$.

8 Claims, 2 Drawing Sheets

5,377,214

TENSILE STRAINED BLUE GREEN II-VI QUANTUM WELL LASER

BACKGROUND OF THE INVENTION

1. Field of the Invention

The present invention relates, in general, to a II-VI quantum well laser emitting a blue-green light and, more particularly, to a tensile strained blue-green II-VI quantum well laser having an active region consisting of ZnSSe quantum well with tensile strain and a barrier region allowed to lattice match with ZnSe, capable of lowering threshold current densities and of shortening oscillation wavelength.

2. Description of the Prior Art

Even though II-VI semiconductors are attractive for potential optoelectronic devices in a blue-green spectrum, they have been slowly developed in the early time because of the difficulty in growing high-quality heterostructures, in making p-n junctions and in forming ohmic or low-resistivity contacts. The presence of a large number of background impurities and the lack of understanding the role of shallow acceptors and donors also have hindered the progress of the above II-VI semiconductors.

Recent advances in growth technology of II-VI materials, such as organo-metallic vapor phase epitaxy (hereinafter "OMVPE") and molecular beam epitaxy (hereinafter "MBE"), now allow the growing of high-quality heterostructures with reduced background impurities ranging from $10^{14}$ to $10^{15}$ cm$^{-3}$ and with doping levels ranging from $10^{17}$ to $10^{18}$ cm$^{-3}$, leading to the realization of p-n junction lasers in the blue-green spectrum.

By the way, the threshold current densities of these II-VI quantum well lasers are believed to be substantially larger than those of GaAs quantum well lasers. This is partially due to the fact that the optical gain of a ZnSe quantum well is much smaller than that of the GaAs quantum well under the same injection condition.

On the other hand, it is well known that biaxially or uniaxially strained quantum well, such as InGaAs-AlGaAs, have enhanced optical gain as compared with unstrained quantum wells, such as GaAs-AlGaAs. This suggests that the unfavorably situation for II-VI quantum well lasers can be overcome by introducing well-engineered biaxial compressive strain. Biaxially compressed II-VI quantum wells can be achieved by choosing the barrier material with a smaller lattice constant than that of the active region.

Description is given next for a conventional blue-green II-VI quantum well laser for better understanding of the background of the present invention, with reference to FIG. 1. As shown in this figure, one of the possible candidates for a biaxially compressed quantum well is a $Cd_xZn_{1-x}Se$-$ZnS_ySe_{1-y}$ system.

That is, on a p type GaAs substrate 11, there are grown a p type ZnSe layer 12, a p type $ZnS_ySe_{1-y}$ cladding layer 13, a non-doped $Cd_xZn_{1-x}Se$ active region 14, which is at most several hundreds Å thick, an n type $ZnS_ySe_{1-y}$ cladding layer 15, an n type current-restricting layer, an n type ZnSe layer 17 and an n+ cap layer 18, in due order, where $0 \leq y \leq 0.07$ and $0 \leq x \leq 0.25$.

If the active region 14 consists of ZnSe in the conventional strained blue-green II-VI quantum well laser having the above structure, the optical gain of the active region quantum well becomes very small. However, while the addition of Cd to the ZnSe active region in amounts of not more than 25% for making the lattice constant of the active region 14 be larger than that of the cladding layers 13 and 15 allows the optical gain of the active region quantum well to increase as well as applies biaxial compressive strain to the active region, the oscillation wavelength of II-VI laser becomes lengthy in proportion to the amount of Cd added.

Consequently, the conventional strained blue-green II-VI quantum well laser has a limit such that its oscillation wavelength does not become shorter than 500 nm.

SUMMARY OF THE INVENTION

Therefore, an object of the present invention is to solve the above problems encountered in the prior art and to provide a tensile strained blue-green II-VI quantum well laser having an active region consisting of a tensile strained quantum well, capable of oscillating a shorter wavelength.

In accordance with the present invention, the above object and other advantages can be accomplished by providing a tensile strained blue-green II-VI quantum well laser, comprising: a semiconductor substrate; a buffer layer formed on the semiconductor substrate; a first ZnSe cladding layer formed on the buffer layer; a multi-quantum well layer formed on the first ZnSe cladding layer, consisting of a $ZnS_ySe_{1-y}$ active region and a $Mg_zZn_{1-z}S_wSe_{1-w}$ barrier region; a current-restricting layer formed on the multi-quantum well layer; a second ZnSe cladding layer formed on the current-restricting layer; and a cap layer formed on the second ZnSe cladding layer.

BRIEF DESCRIPTION OF THE DRAWINGS

Other objects and aspects of the invention will become apparent from the following description of embodiments with reference to the accompanying drawings in which.

DETAILED DESCRIPTION OF THE INVENTION

Hereinafter, the preferred embodiment of the present invention along with its characteristics will be, in detail, explained with reference to some drawings.

Figure 1:
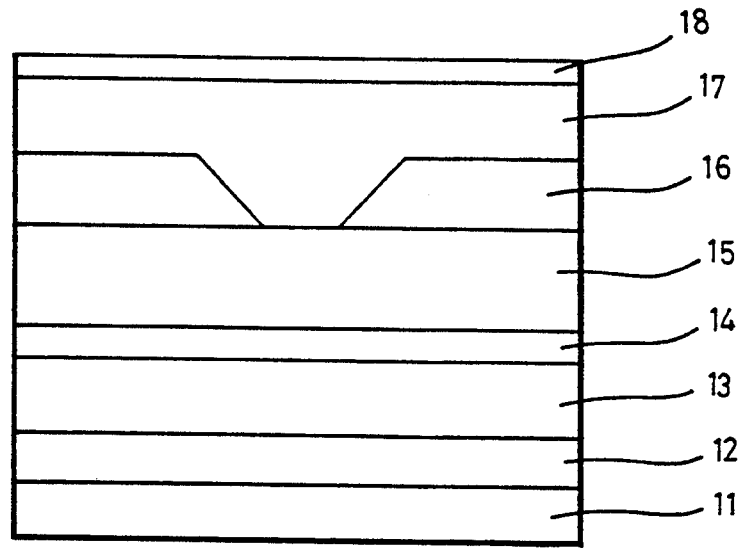
FIG. 1 is a schematic, cross-sectional view showing a conventional blue-green II-VI quantum well laser.
Figure 2:
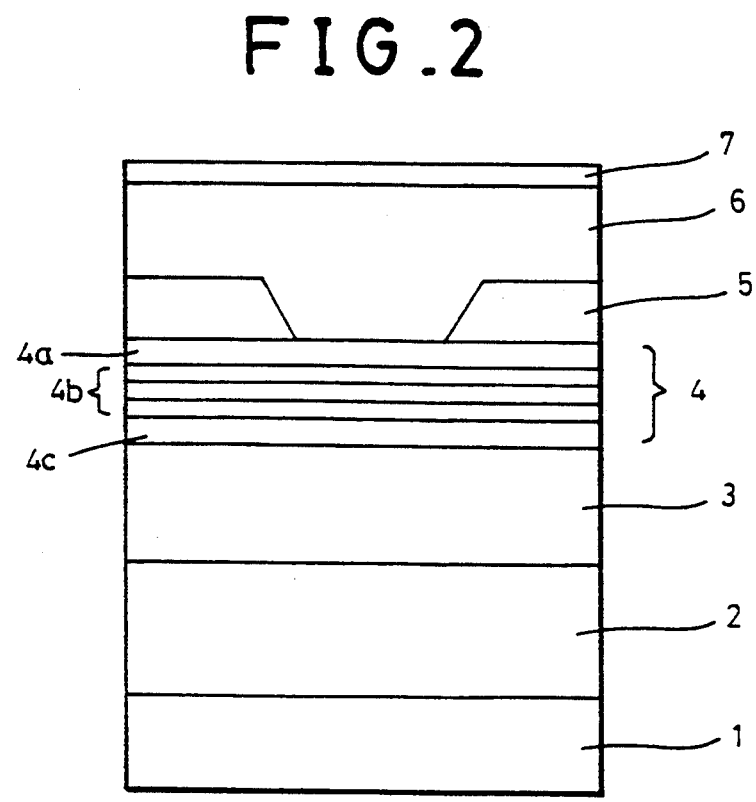
FIG. 2 is a schematic, cross-sectional view showing a tensile strained blue-green II-VI quantum well laser according to the present invention.

First referring to FIG. 2, there are illustrated the structure of a tensile strained blue-green II-VI quantum well laser according to the present invention. The inventive tensile strained blue-green II-VI quantum well laser, as shown in FIG. 2, has a p type GaAs substrate 1 on which, a p type $Ga_{1-x}As$ layer 2, a p type ZnSe 3, a multi-quantum well active layer 4, an n type current-restricting layer 5, an n type ZnSe layer 6 and an n+ ZnSe cap layer 7 are grown by MBE process, in due order, where $0 \leq y \leq 0.1$ and $0.05 \leq x \leq 0.08$.

Herein, the multi-quantum well active layer 4 consists of an upper $Mg_zZn_{1-z}S_wSe_{1-w}$ barrier region 4a, a mid $ZnS_ySe_{1-y}$ active region 4b and a lower $Mg_zZn_{1-z}S_wSe_{1-w}$ barrier region 4c, where $0 \leq y \leq 0.1$, $0 \leq z \leq 0.1$ and $0 \leq w \leq 0.1$.

In the meanwhile, the $ZnS_ySe_{1-y}$ active region 4b may consist of a plurality of tiers, for example, $4b_1$, $4b_2$ and $4b_3$ which are different in composition ratio, one another.

Numerals, z and w are to be controlled in such a way to make the lattice constant of MgZnSSe be identical to that of ZnSe or GaAs. Accordingly, since the lattice constant of the $ZnS_ySe_{1-y}$ active region 4b always becomes smaller than that of the ZnSe layers 3 and 6, tensile strain is applied to the quantum well.

In addition, the energy band gap between the quantum well active region 4b and the barrier regions 4a, 4c in the ZnSSe/MgZnSSe-based quantum well structure is larger than that between an active region and a cladding layer in CdZnSe/ZnSSe quantum well structure, contributing improved quantum confinement effect of electrons and holes to the increase of optical gain.

Further, the oscillating wavelength from the ZnSSe/MgZnSSe-based quantum well structure becomes shorter than that from CdZnSe/ZnSSe quantum well structure because band gap energy in the ZnSSe quantum well active region 4b is larger than that in the conventional CdZnSe quantum well active region 14. In detail, the band gap energies of MgS and MgSe are 4.5 eV and 3.6 eV, respectively, so that the energy band offsets $\Delta E_c$ and $\Delta E_v$ will be probably larger than those of CdZnSe-ZnSSe heterostructures. In addition, the refractive index of MgZnSSe regions 4a and 4c is smaller than that of ZnSSe. Moreover, since ZnSSe has a wider band gap than CdZnSe, a ZnSSe-MgZnSSe quantum well emits light at shorter wavelength than a CdZnSe-ZnSSe quantum well.

In the meanwhile, the ZnSe layer 3 can be allowed to lattice match with the InCaAs buffer layer with 4 to 5% by mole fraction of In.

Mole fractions of (Mg, Zn) and (S, Se) in the barrier regions 4a and 4c are chosen to allow lattice match with the ZnSe p-n cladding layers 3 and 5. In this case, since the lattice constant of the ZnSSe region 4b would be smaller than that of the ZnSe layers 3 and 6, the quantum well has tensile strain.

Accordingly, in case that a quantum well with biaxial tensile strain consists of the 75 Å $ZnS_{0.1}Se_{0.9}$ quantum well 4b surrounded by $Mg_xZn_{1-x}S_ySe_{1-y}$ outer barrier regions 4a and 4c, balance-subband shows that the quantum well has a biaxial tensile strain potential of 12.3 mV, corresponding to a strain of 0.455%. The biaxial tensile strain separates HH and LH subbands by pulling down the LH subbands and pushing away the HH subbands from the valence band edge. In the ZnSSe-MgZnSSe quantum well, the TM mode gain would be substantially larger than the TE mode gain.

Figure 3:
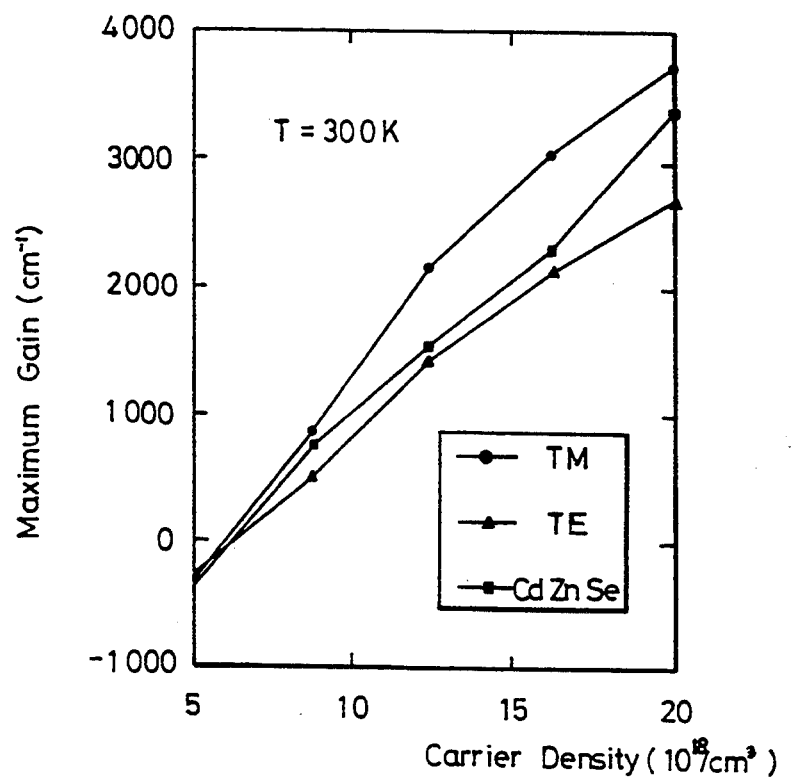
FIG. 3 plots peak gains for TE- and TM polarizations in the tensile strained blue-green II-VI quantum well laser according to the present invention.

Referring now to FIG. 3, there are plotted peak gains for TE- and TM-polarizations in a 75 Å $ZnS_{0.1}Se_{0.9}$-$Mg_xZn_{1-x}S_ySe_{1-y}$ quantum well with tensile strain and a 75 Å $cd_{0.12}Zn_{0.88}Se$-$ZnS_{0.06}Se_{0.94}$ quantum well versus the injected carrier density. As shown in FIG. 3, it is predicted that the gain and differential gain of the ZnSSe quantum well (TM polarization) are comparable to or slightly larger than those (TE polarization) of the CdZnSe-based quantum well at the given carrier density.

Figure 4:
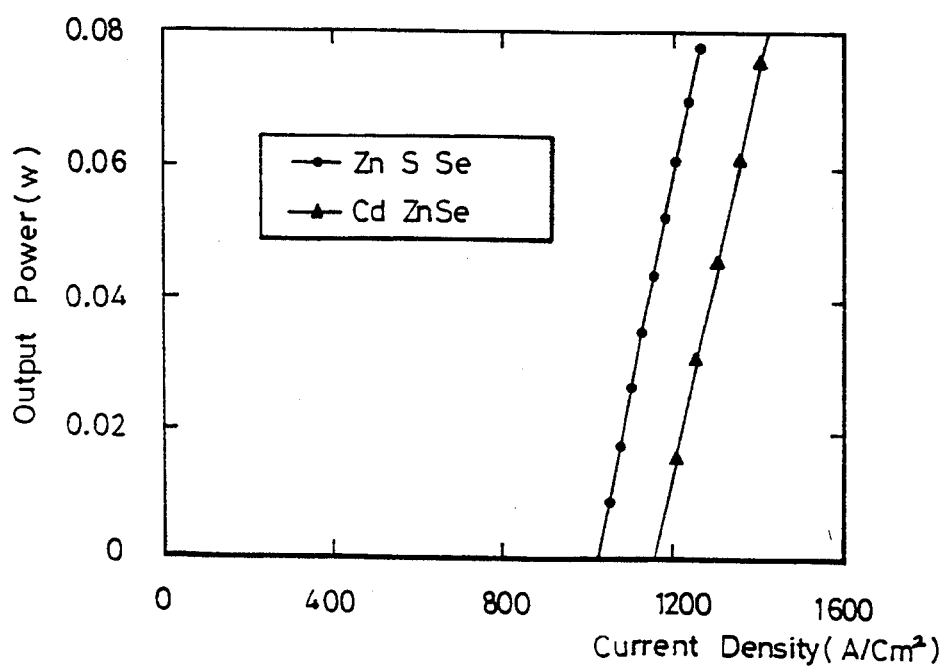
FIG. 4 shows threshold current densities of the tensile strained blue-green II-VI quantum well laser according to the present invention.

Turning now to FIG. 4, there are shown L-I characteristic curves at room temperature for 75 Å $ZnS_{0.1}Se_{0.9}$-$Mg_xZn_{1-x}S_ySe_{1-y}$ as well as for 75 Å $cd_{0.12}Zn_{0.88}Se$-$ZnS_{0.06}Se_{0.94}$ quantum well lasers. From this figure, it is expected that a threshold current density as low as 1,000 A/cm$^2$ can be obtained for the $ZnS_{0.1}Se_{0.9}$-$Mg_xZn_{1-x}S_ySe_{1-y}$ quantum well laser with an oscillation wavelength of about 490 nm whereas a threshold current density as low as 1,200 A/cm$^2$ can be obtained for the $cd_{0.12}Zn_{0.88}Se$-$ZnS_{0.06}Se_{0.94}$ quantum well laser with an oscillation wavelength of about 520 nm.

According to the present invention, as described hereinbefore, there are brought effects such that the inventive tensile strained blue-green II-VI quantum well laser is capable of reducing the oscillation wavelength into not more than 500 nm at room temperature and of lowering the threshold current density to as low as 1,000 A/cm$^2$.

Although the preferred embodiment of the present invention has been disclosed for illustrative purposes, those skilled in the art will appreciate that various modifications, additions and substitutions are possible, without departing from the scope and spirit of the present invention as disclosed in the accompanying claims.

What is claimed is:

1. A tensile strained blue-green II-VI quantum well laser, comprising:
   a semiconductor substrate;
   a buffer layer formed on said semiconductor substrate;
   a first ZnSe cladding layer formed on said buffer layer;
   a multi-quantum well layer formed on said first ZnSe cladding layer, consisting of a $ZnS_ySe_{1-y}$ active region and a $Mg_zZn_{1-z}S_wSe_{1-w}$ barrier region;
   a current-restricting layer formed on said multi-quantum well layer;
   a second ZnSe cladding layer formed on said current-restricting layer; and
   a cap layer formed on said second ZnSe cladding layer.

2. A tensile strained blue-green II-VI quantum well laser according to claim 1, wherein said $ZnS_ySe_{1-y}$ active region is under the condition of $0 \leq y \leq 0.1$.

3. A tensile strained blue-green II-VI quantum well laser according to claim 1, wherein said $ZnS_ySe_{1-y}$ active region consists of a plurality of tiers that are different in y value.

4. A tensile strained blue-green II-VI quantum well laser according to claim 1, wherein said $Mg_zZn_{1-z}S_wSe_{1-w}$ barrier region is under the condition of $0 \leq z \leq 0.1$ and $0 \leq w \leq 0.1$.

5. A tensile strained blue-green II-VI quantum well laser according to claim 1, wherein z and w values are determined in such a way that the lattice constant of said $Mg_zZn_{1-z}S_wSe_{1-w}$ barrier region is the same as that of said first and second ZnSe cladding layers.

6. A tensile strained blue-green II-VI quantum well laser according to claim 1, wherein z and w values are determined in such a way that the lattice constant of said $Mg_zZn_{1-z}S_wSe_{1-w}$ barrier region is the same as that of said GaAs substrate.

7. A tensile strained blue-green II-VI quantum well laser according to claim 1, wherein the lattice constant of said $ZnS_ySe_{1-y}$ active region is smaller than that of said first and second ZnSe cladding layers.

8. A tensile strained blue-green II-VI quantum well laser according to claim 7, wherein tensile strain is applied to said $ZnS_ySe_{1-y}$ active region.

* * * * *